(12) United States Patent
Groos et al.

(10) Patent No.: US 6,870,739 B2
(45) Date of Patent: Mar. 22, 2005

(54) HOUSING

(75) Inventors: Hartmut Groos, Bischoffen (DE); Thomas Nagel, Weinbach (DE)

(73) Assignee: Koninklijke Philips Electronics N.V., Eindhoven (NL)

(*) Notice: Subject to any disclaimer, the term of this patent is extended or adjusted under 35 U.S.C. 154(b) by 50 days.

(21) Appl. No.: 10/221,068
(22) PCT Filed: Jan. 8, 2002
(86) PCT No.: PCT/IB02/00030
§ 371 (c)(1), (2), (4) Date: Sep. 6, 2002
(87) PCT Pub. No.: WO02/056656
PCT Pub. Date: Jul. 18, 2002

(65) Prior Publication Data
US 2003/0038568 A1 Feb. 27, 2003

(51) Int. Cl.⁷ .................................................. H05K 5/03
(52) U.S. Cl. ...................... 361/725; 361/724; 312/223.6
(58) Field of Search ............................... 361/724–726, 361/685; 312/7.1, 242, 246, 263, 223.6

(56) References Cited

U.S. PATENT DOCUMENTS

| 3,349,289 | A | 10/1967 | Mueller | 317/101 |
| 4,813,194 | A | 3/1989 | Dobyns et al. | 52/309.13 |
| 6,351,374 | B1 * | 2/2002 | Sherry | 361/685 |

* cited by examiner

Primary Examiner—Yean-Hsi Chang

(57) ABSTRACT

The invention relates to a housing. Housing walls (1) are provided which are formed so as to be integral and collapsible, constituting the housing in the collapsed state, and which are fitted with functional elements (8) and closing elements (5) of synthetic resin injection-molded onto the housing walls (1), which closing elements (5) are designed so as to be movable.

8 Claims, 5 Drawing Sheets

HOUSING

Figure 1:
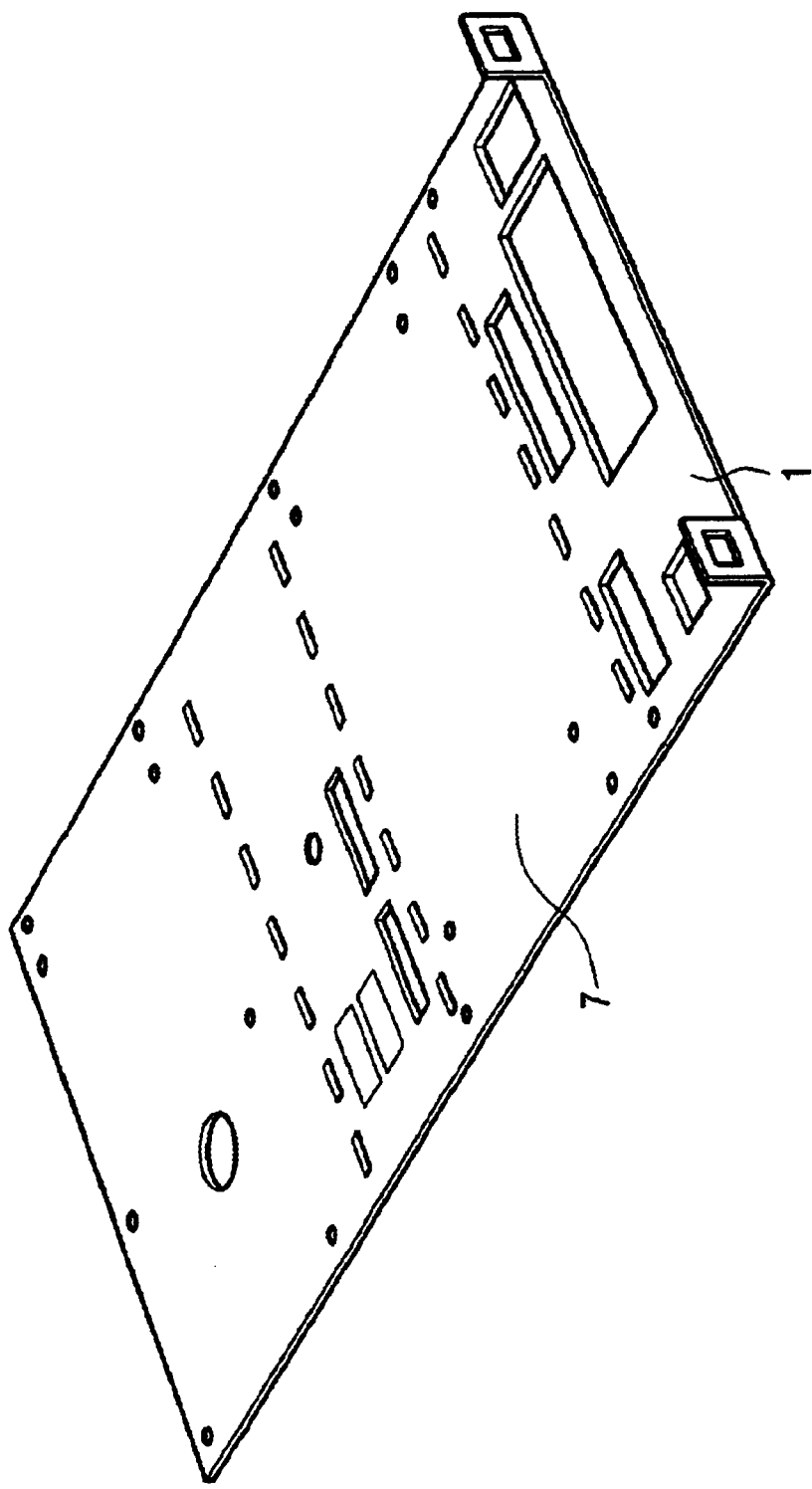

The invention relates to a housing, in particular for accommodating the electrical and mechanical components of an audio, video, or navigation system in a motor vehicle.

It is known that car radios and navigation systems in motor vehicles are practically always mounted in a so-called DIN compartment of standardized size. The housings accordingly also have a standardized size. The standardized dimensions mean that the housings can be manufactured in large batches in a cost-effective manner. The housings are usually held together by means of screws.

It is an object of the present invention to simplify the manufacture of the housing further, in particular for car radios, and thus to achieve an even more cost-effective and fast manufacture, while at the same time the mounting of printed circuit boards and other electrical components to the housing is facilitated.

According to the invention, this object is achieved in that a housing is provided with side walls which are of an integral and collapsible construction, which in the collapsed state form the housing, and which are provided with functional elements and closing elements of synthetic resin injection-molded onto the housing walls, while the closing elements are arranged so as to be movable.

The housing walls comprise the bottom, the top, and the rear and front walls. These walls are movably interconnected by means of bending seams and may thus be laid out flat. The bottom is manufactured as a self-supporting carrier plate and thus gives the housing the necessary stability. The housing walls can be manufactured in one operation in that they are stamped out from sheet metal. Then functional elements and closing elements, which additionally stabilize and also close the housing, are subsequently injection-molded onto the housing walls by the outsert technique. This renders possible a cost-effective and fast manufacture in large batches.

The embodiment as defined in claim 2 presents a particularly simple possibility for fastening electronic components and other components in the housing. The side walls are also fastened in this manner. Snap connections are provided for this purpose on the housing walls, into which the components are simply inserted so as to be snapped home and retained. This represents a stable and load-resistant connection to the housing, which is of particular importance for the side walls. Such a stable fastening is also ideal for heavy components such as CD/DVD drives. Welded joints and screw connections are unnecessary in this way.

The embodiment of claim 3 renders it possible to lock the housing after collapsing in a simple manner without additional screws or welded joints, which locking can be undone in that the closing elements are turned into their original position again.

The major advantage of claim 4 is that the electronic and electrical components provided in the housing are interconnected without the use of cables. An expensive wiring system is made unnecessary thereby.

In claims 5 and 6, the advantages of a housing according to the invention are applied to the use in car radios and similar appliances. Since car radios are manufactured in large series, the simple construction of the housing and its fast manufacture are of particular importance in this field.

Claim 7 defines a method of manufacturing a housing according to the invention. The housing walls are integrally stamped from one piece of sheet metal here. This renders possible a single-step and cost-effective manufacture of large batches. Subsequently, in a next step, the synthetic resin components are injection-molded thereto. This is also possible in one operational step with the outsert technique.

The embodiment according to claim 8 allows of a particularly simple mounting of components to the housing, because the latter is freely accessible in the folded-out state.

The embodiment according to claim 9 renders any cabling unnecessary. The devices necessary for the attachment of cables may thus be left out. In addition, the absence of cables means a saving of space in the interior of the housing.

The embodiment of claim 10 renders it possible to fold the housing module into shape in a simple manner after the provision of electronic components, drives, etc., and to secure it in a reliable manner by means of the movable closing elements, so that no screw connections are necessary, which simplifies the manufacturing process.

In the embodiment according to claim 4, the electrical connections between the individual components are achieved simultaneously with the folding into shape of the housing module. This may thus be achieved in one process step in the manufacture of the housing. The laying of cables between the individual components thus becomes redundant. This represents a further considerable simplification of the manufacturing process.

Figure 2:
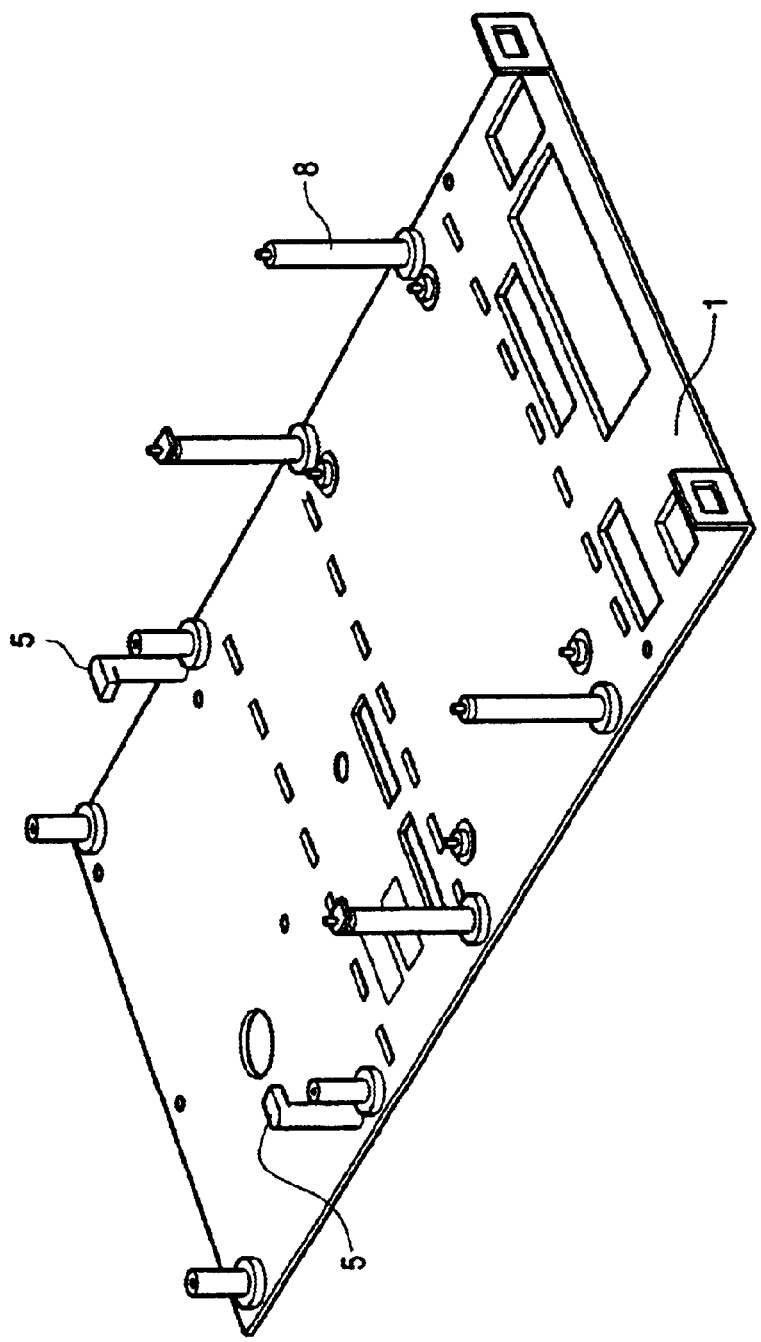
Figure 3:
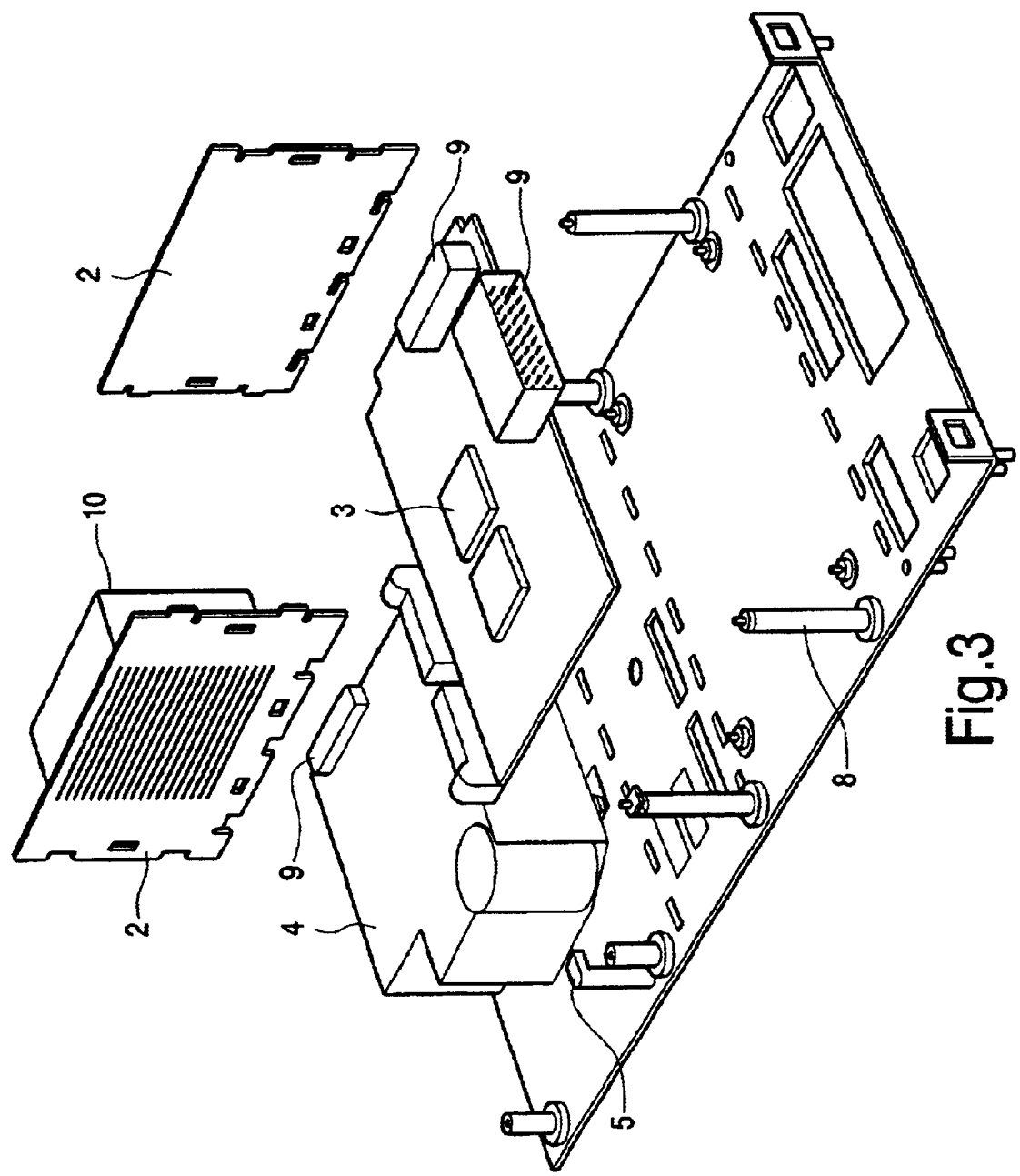
Figure 4:
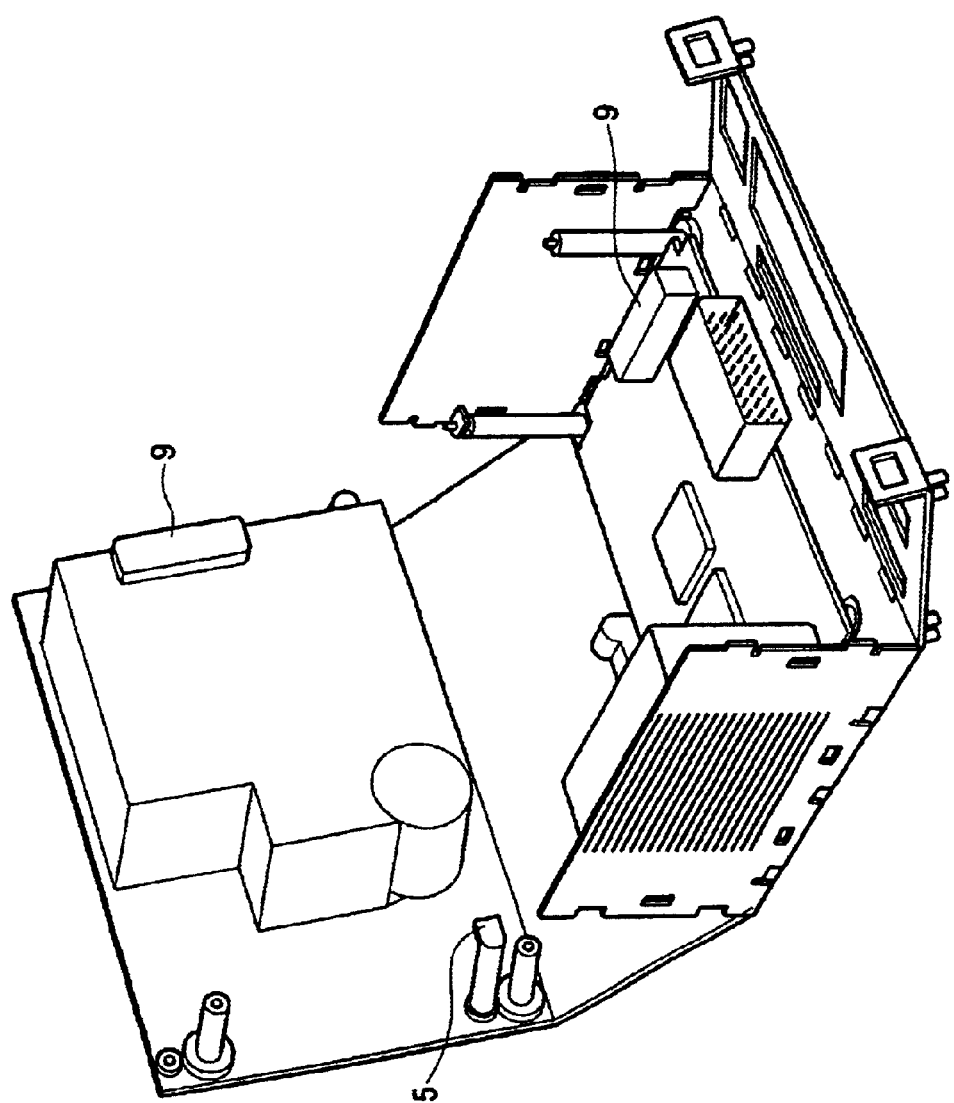
Figure 5:
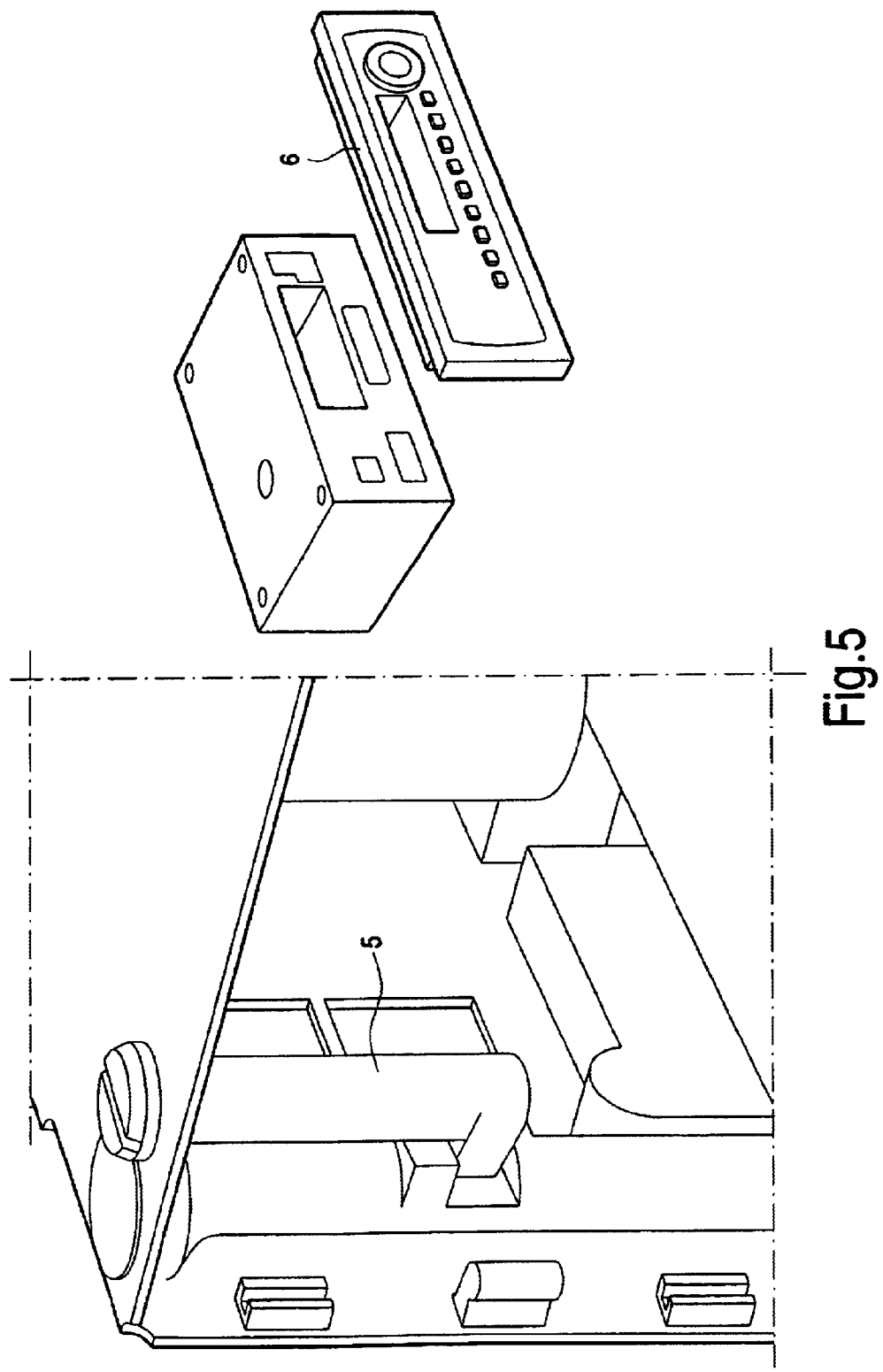

An embodiment of the invention will now be explained in more detail below with reference to a number of Figures, wherein:

FIG. 1 shows housing walls with a carrier plate in the folded-out state,

FIG. 2 shows the housing walls with the carrier plate provided with functional and closing elements, FIG. 3 shows the housing walls in the process of being additionally provided with side walls, a drive unit, and a control circuit board, FIG. 4 shows a housing fitted with components during folding into shape, and FIG. 5 shows a housing with closing elements in the closed state and with a control panel which is to be attached thereto.

Essential for the housing according to the invention are the housing walls 1. They are preferably made in one piece and comprise a carrier plate 7, onto which in a later stage the electromechanical and electronic components of a car radio or a navigation system will be mounted, as well as the top and the front and rear walls. A particularly suitable material is metal, i.e. the housing walls 1 can be stamped out from a sheet of metal. The stamped-out housing walls 1 are visible in FIG. 1 in the original developed state, i.e. the way they issue from the stamping machine. The sheet metal is flexible in the transition zones between the carrier plate 7 and the side walls and between the rear and the top, so that the housing walls 1 can be collapsed later. The bending possibility is achieved by means of grooving and other treatments. It is also possible to provide the bending seams with recesses and to provide synthetic resin hinges therein. These hinges would then be manufactured in the next step as described below.

In a second step, functional elements 8 and closing elements 5 are injection-molded onto the housing walls 1. This is done by the so-termed outsert technique. All synthetic resin elements are thus provided on the housing walls in one step and are indetachably joined thereto. An additional feature is that the synthetic resin elements may be made of different materials which are injection-molded simultaneously or in quick succession. The result of this manufacturing step is shown in FIG. 2.

Side walls 2 are inserted into the folded-out housing walls 1 in a further step. The side walls are fastened to the housing walls 1 by means of snap joints, the side walls 2 also being used as carriers for further components 10. Cassette, CD, and DVD drive units 4 are fastened to the carrier plate 7 in a similar manner. The printed circuit board 3 with the control electronics and the signal processing unit is also fixed to the carrier plate 7 by means of snap connections, as is visible from FIG. 3. Screw connections are made unnecessary thereby. It is furthermore visible in FIG. 3 that all electrical components have plug-and-pin contacts 9 by means of which the electrical connections between the individual components are effected.

FIG. 4 shows how the housing walls 1 are folded (collapsed) into shape. During collapsing, the plug-and-pin contacts 9 of the electrical components are at the same time connected to one another, so that all electrical connections are established the moment the housing is closed. Any cabling becomes redundant as a result of this. The housing is locked in that the closing elements 5 are rotated as shown in FIG. 5. It is alternatively possible to use sliding closing elements instead of rotating ones. The front panel 6 with operational controls is attached to the finished housing, as is also shown in FIG. 5. The electrical connection is again achieved by means of plug-and-pin contacts here.

The functional elements 8 and the closing elements 5 as well as the recesses in the housing walls 1 necessary for the snap connections are shaped such that many arrangements of drive units 4 and printed circuit boards 3 are possible. For this reason, more recesses are present than are necessary for a given single product. One and the same housing may thus accommodate cassette radios, radios with CD/DVD drive units, or navigation systems, as applicable. The housing according to the invention may obviously also be used for other appliances, in particular for components of HiFi systems or for video recorders and DVD players.

What is claimed is:

1. A housing with housing walls (1) which are of an integral and collapsible construction and which in the collapsed state form the housing, and with functional elements (8) and closing elements (5) of synthetic resin injection-molded onto the housing walls (1), which closing elements (5) are manufactured so as to be movable, said closing elements being turnable, and said housing walls (1) in the collapsed state can be locked by the means of said closing elements (5).

2. A housing as claimed in claim 1, wherein said housing walls (1) are fitted with variable side walls (2), control circuit boards (3), and drive units (4) and are fastened by means of snap joints.

3. A housing as claimed in claim 1, wherein said electrical connections between the individual components (3, 4, 10) in the collapsed housing are effected without cables by means of plug-and-pin (9) contacts.

4. A housing as claimed in claim 1, wherein said housing is designed for accommodating the components of an audio, video, or navigation system in a vehicle.

5. An electronic appliance, in particular an audio, video, or navigation system in a vehicle, wherein said electronic appliance has a housing as claimed in claim 1.

6. A method of manufacturing a housing as claimed in claim 1, wherein said integrally formed housing walls (1) are manufactured from one piece of sheet metal, said functional elements (8) and said movable closing elements (5) are injection-molded onto said housing walls (1), and said collapsed housing walls (1) are locked through turning of said closing elements (5).

7. A method as claimed in claim 6, wherein said housing walls (1) are fitted with control circuit boards (3), side walls (2), and other components (4) while in the folded-out state.

8. A method as claimed in claim 6, characterized in that the wherein said housing walls (1) are collapsed so as to form a housing, and in that during collapsing of the housing walls (1) the electrical connections between the individual electrical components (3, 3, 10) are effected by means of plug-and-pin contacts (9).

* * * * *